(12) United States Patent
Kobayashi

(10) Patent No.: US 6,806,778 B1
(45) Date of Patent: Oct. 19, 2004

(54) DARLINGTON CASCODE

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 0 days.

(21) Appl. No.: 10/368,530

(22) Filed: Feb. 18, 2003

(51) Int. Cl.[7] .................................................. H03F 1/22
(52) U.S. Cl. ........................................................ 330/311
(58) Field of Search ............................ 330/98, 99, 100, 330/283, 311; 323/313, 314

(56) References Cited

U.S. PATENT DOCUMENTS

| | | | |
|---|---|---|---|
| 4,312,011 A | 1/1982 | Kanbayashi | 357/46 |
| 4,485,301 A * | 11/1984 | Gontowski et al. | 250/214 A |
| 4,616,144 A | 10/1986 | Hideshima et al. | 307/315 |
| 4,706,038 A | 11/1987 | Navidi et al. | 330/271 |
| 4,755,694 A | 7/1988 | Bodig et al. | 307/315 |
| 4,777,386 A | 10/1988 | Majumdar | 307/270 |
| 5,397,914 A | 3/1995 | Suda et al. | 257/570 |
| 5,661,431 A | 8/1997 | Ueno et al. | 327/483 |
| 5,923,211 A * | 7/1999 | Maley et al. | 327/540 |

* cited by examiner

*Primary Examiner*—Steven J. Mottola
(74) *Attorney, Agent, or Firm*—Christopher P. Maiorana, P.C.

(57) ABSTRACT

An apparatus comprising a Darlington transistor pair and a common-base transistor. The Darlington transistor pair may be configured to generate an output signal at an output node in response to an input signal received through an input node. The common-base transistor may be coupled between an output transistor of the Darlington transistor pair and the output node. The common-base transistor may have a base configured to receive a reference voltage.

29 Claims, 9 Drawing Sheets

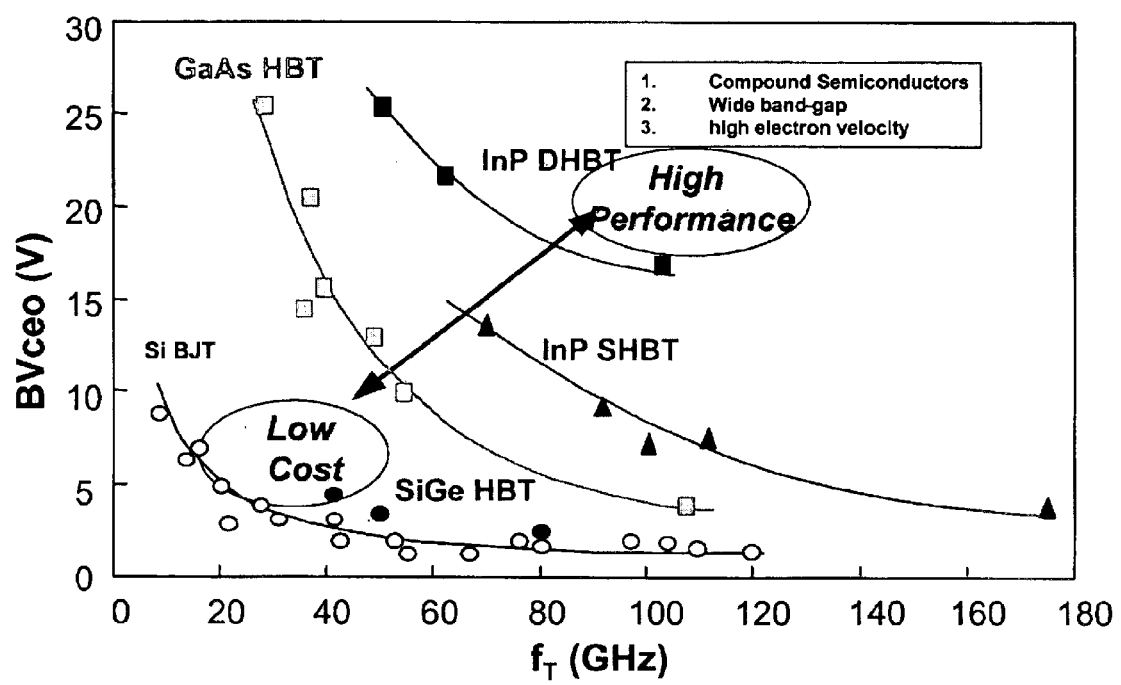
(CONVENTIONAL)
FIG. 1

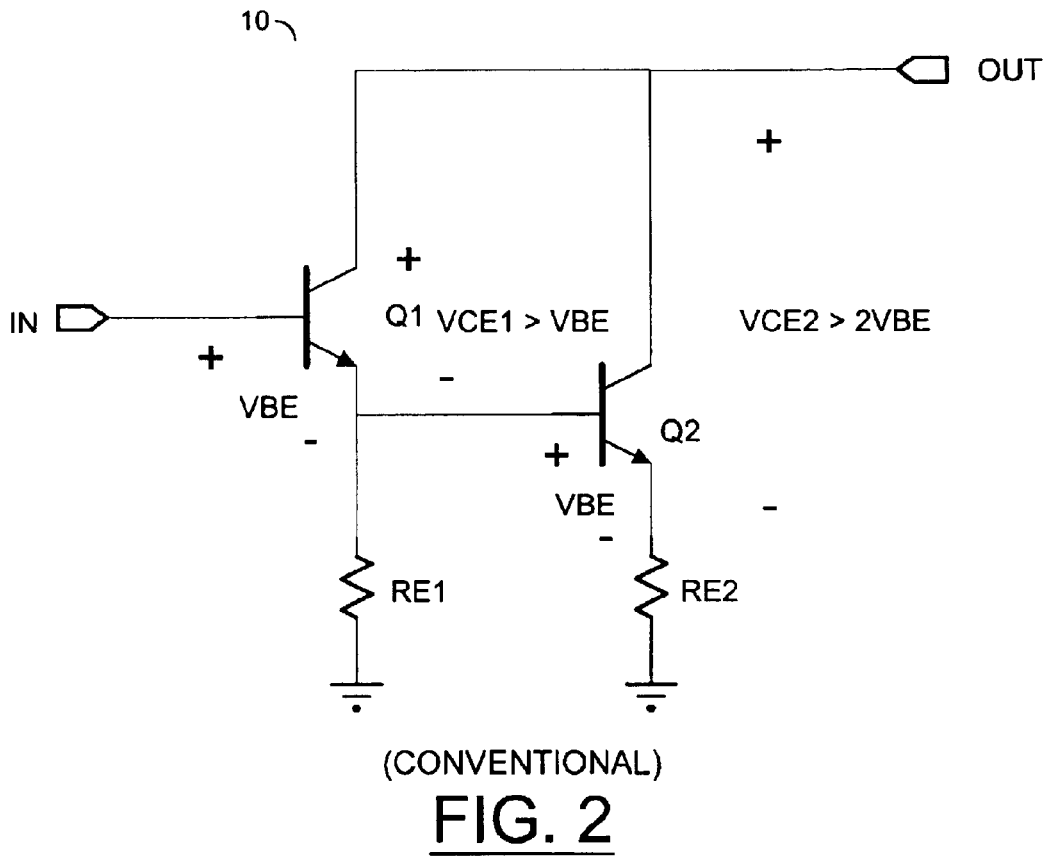
(CONVENTIONAL)
FIG. 2
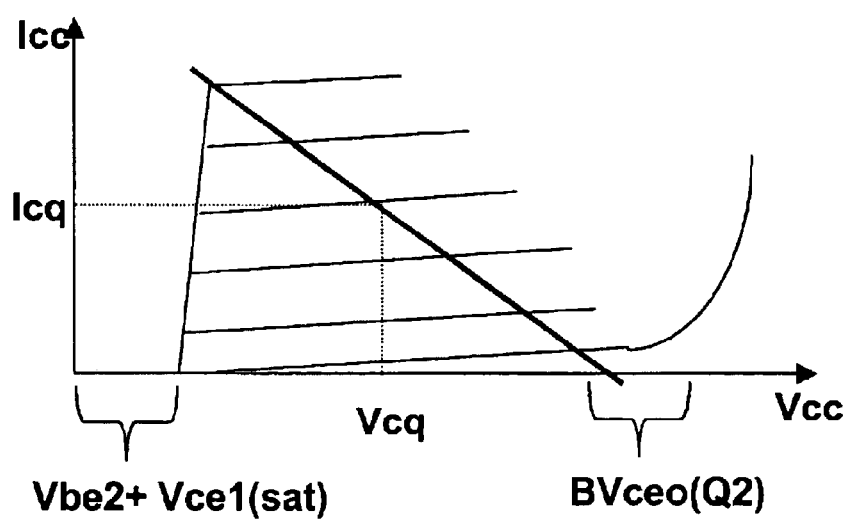
(CONVENTIONAL)
FIG. 3

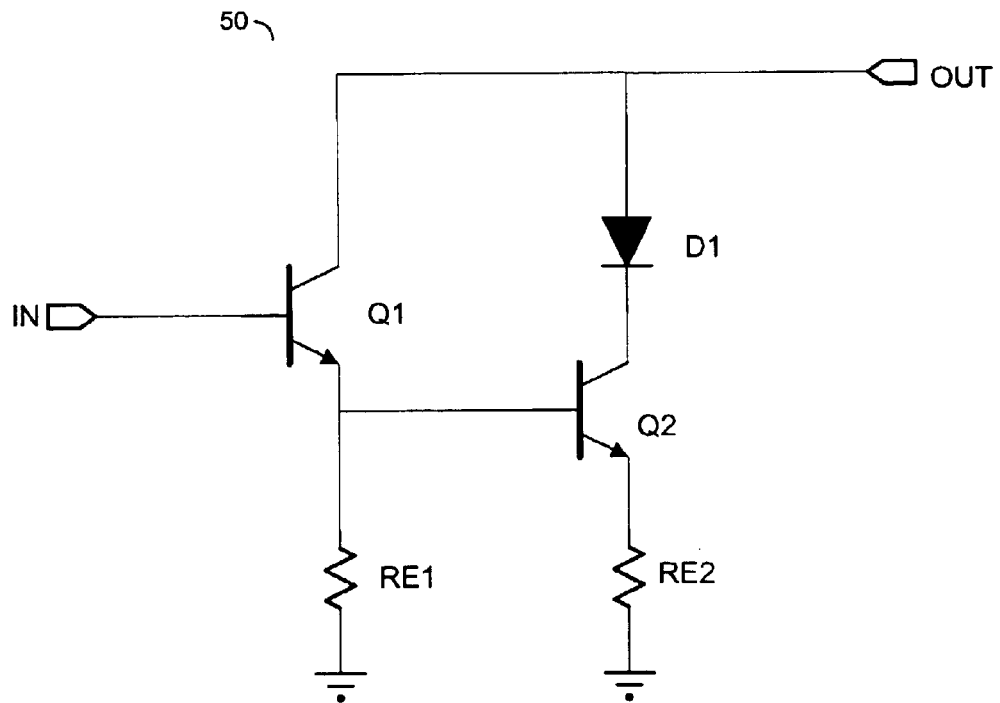
(CONVENTIONAL)
FIG. 4
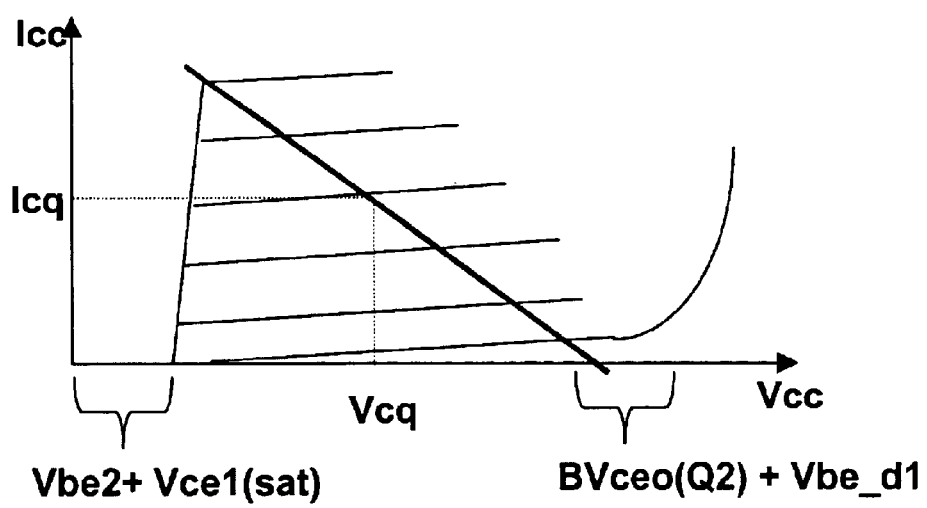
(CONVENTIONAL)
FIG. 5

DARLINGTON CASCODE

FIELD OF THE INVENTION

The present invention relates to a method and/or architecture for implementing amplifiers generally and, more particularly, to a method and/or architecture for implementing an internally cascaded Darlington amplifier.

BACKGROUND OF THE INVENTION

Conventional multi-decade direct-coupled amplifiers are used in broadband applications such as instrumentation, fiber optics communication, and fast computing systems. Wide-bandwidth is achieved by combining broadband circuit topologies, like distributed and Darlington feedback amplifiers, with a high speed technology like Silicon Germanium (SiGe) or Indium Phosphide (InP) heterojunction bipolar transistor (HBT) architectures. However, high speed technologies typically compromise breakdown voltage for increased cut-off frequency (fT).

Referring to FIG. 1, a bipolar (BJT, HBT) breakdown voltage versus device cut-off frequency speed (fT) of various semiconductor device technologies is shown. For a given bipolar semiconductor technology, there is a constrained trade off between breakdown voltage and device speed, known as the "Johnson Limit". Compound semiconductors such as Gallium Arsenide (GaAs) and InP HBTs whose material properties provide higher electron velocities (as well as direct and wide bandgaps) offer a higher breakdown versus fT product curve. However, in order to exploit their ultimate speeds, compound semiconductors still must be designed with a relatively low breakdown voltage. This can mean pushing the respective technologies to a point where the breakdown voltage (BVceo) is lower than 2 Vbe, considered the minimum limit for high frequency operation of the conventional Darlington topology.

Referring to FIG. 2, a diagram of a circuit 10 illustrating a conventional approach is shown. The circuit 10 is shown having a transistor Q1, a transistor Q2, a resistor RE1, and a resistor RE2. FIG. 3 illustrates a plot of the output characteristics of a conventional Darlington amplifier. FIG. 3 assumes a simple case where the resistor RE2=0 and also assumes a large base source impedance to calculate limits where finite base source impedance is meant to provide design margin.

To ensure high frequency performance, the transistor Q1 must be strongly biased in the forward active region so the collector to emitter voltage Vce1 is at least one Vbe. For high frequency operation, the bias of the transistor Q2 has a collector to emitter voltage Vce2 greater than 2 Vbe. For a given DC output voltage, there will typically be a voltage of one VBE more across the transistor Q2 than across the transistor Q1. The emitter voltage Vce2 of the transistor Q2 sets the maximum reliable operating voltage of the conventional Darlington amplifier (assuming similar base impedances presented to both the transistor Q1 and the transistor Q2). Therefore, for robust operation, the transistor technology used must have a breakdown voltage BVceo greater than 2 Vbe for low current density operation (less than 0.5 mA/um$^2$) and, more practically, a breakdown voltage BVceo greater than 4 Vbe for high current density wideband operation (i.e., greater than 0.75 mA/um$^2$). The latter is more practical since the breakdown voltage BVceo is the breakdown under zero collector current and the device breakdown voltage BVce strongly degrades with increased collector current density.

Referring to FIG. 4 a circuit 50 is shown illustrating another conventional Darlington amplifier. The circuit 50 is shown having a transistor Q1, a transistor Q2, a resistor RE1, a resistor RE2, and a diode D1. FIG. 5 illustrates a plot of the output of the circuit 50. FIG. 5 assumes a simple case where the resistor RE2=0. In order to increase the practical breakdown voltage and corresponding operating voltage of the conventional Darlington, the diode D1 is sometimes placed in series with the collector of the transistor Q2. This increases the maximum output operating voltage by one diode drop. In this case, the transistor Q1 and the transistor Q2 may impose an equal constraint on breakdown operation of the Darlington. This increases the breakdown voltage of the Darlington amplifier to BVceo+Vbe (D1) and relaxes the BVceo requirement of the process by one VBE. However, the additional diode D1 may have an adverse affect on performance due to the dynamic parallel RC load presented to the output node of the Darlington amplifier cell.

It would be desirable to implement an apparatus which can enhance the breakdown voltage of an amplifier, in particular a Darlington amplifier, while also providing enhanced bandwidth capability.

SUMMARY OF THE INVENTION

The present invention concerns an apparatus comprising a Darlington transistor pair and a common-base transistor. The Darlington transistor pair may be configured to generate an output signal at an output node in response to an input signal received through an input node. The common-base transistor may be coupled between an output transistor of the Darlington transistor pair and the output node. The common-base transistor may have a base configured to receive a reference voltage.

The objects, features and advantages of the present invention include providing a common-base transistor within a Darlington pair that may (i) provide improved breakdown voltage, thermal stability, and bandwidth, (ii) provide a low impedance voltage reference to a common-base transistor to improve breakdown voltage and/or frequency response and/or linearity of the amplifier, (iii) be implemented in a wideband transimpedance amplifier that may be suitable for optical receiver applications, and/or (iv) provide a transimpedance amplifier that may utilize the Darlington Cascode invention in order to obtain improved breakdown, thermal stability, and wider bandwidth when compared to a conventional Darlington based transimpedance amplifier.

BRIEF DESCRIPTION OF THE DRAWINGS

These and other objects, features and advantages of the present invention will be apparent from the following detailed description and the appended claims and drawings in which:

FIG. 1 is a diagram of a bipolar transistor breakdown voltage versus device speed for various semiconductor technologies;

FIG. 2 is a circuit diagram of a conventional Darlington amplifier;

FIG. 3 is a diagram of a response of the conventional Darlington amplifier;

FIG. 4 is a circuit diagram of a modified conventional Darlington amplifier;

FIG. 5 is a diagram of a response of the modified conventional Darlington amplifier of FIG. 4;

DETAILED DESCRIPTION OF THE PREFERRED EMBODIMENTS

The present invention may be useful in 40 Gb/s transimpedance amplifier (TIA) applications. In particular, the present invention may be implemented to provide 50 GHz bandwidth performance. In one example, the present invention may be fabricated using an Indium Phosphide (InP) heterojunction bipolar transistor (HBT) process. However, the present invention may also be implemented using other technologies, such as Silicon Germanium (SiGe), Gallium Arsenide and double heterojunction bipolar transistor (DHBT) architectures.

The present invention generally integrates a common-base transistor within the Darlington pair to establish a Darlington Cascode cell. Adding the common-base transistor may improve an overall breakdown voltage, thermal behavior, and/or bandwidth as compared to a conventional two-transistor Darlington topology. The present invention may also implement a low impedance voltage reference for a base bias of the common-base transistor. The base bias may increase the Darlington breakdown voltage to greater than Vbe+BVceo, improve thermal and electrical stability, improve amplifier linearity, and/or facilitate higher frequency bandwidth performance. Furthermore, the present invention may also include an application of the Darlington Cascode circuit to a transimpedance pre-amplifier design. Such an application may provide increased gain-bandwidth, operating voltage robustness, and/or thermal reliability compared to conventional Darlington amplifier approaches.

Figure 6:
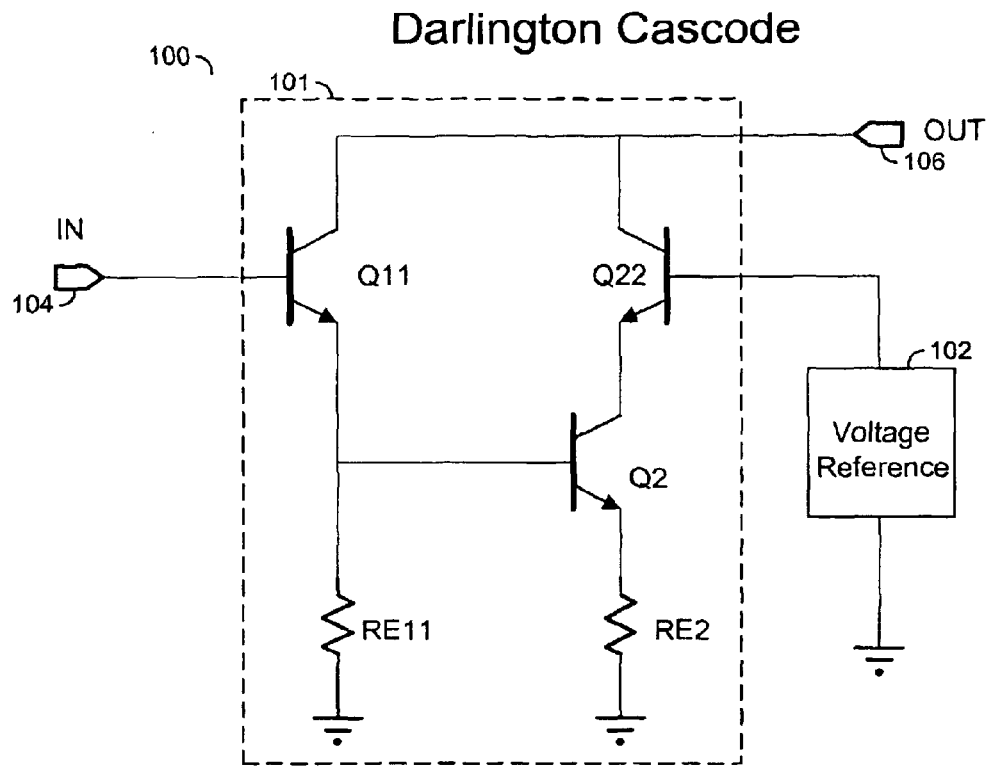
FIG. 6 is a circuit diagram of a preferred embodiment of the present invention.

Referring to FIG. 6, a diagram of a circuit 100 illustrating a Darlington Cascode circuit with an integrated common-base transistor is shown. The circuit 100 generally comprises an output transistor Q2, an input transistor Q11, a transistor Q22, a resistor RE2, a resistor RE11 and a reference voltage circuit 102. The transistor Q2 and the transistor Q11 may comprise a Darlington cell or pair.

A signal (e.g., IN) may be presented through an input node 104 to a base of the transistor Q11. The signal IN may be implemented as a voltage signal. A signal (e.g., OUT) may be generated at an output node 106 from the collectors of the transistors Q11 and Q22. The signal OUT may be implemented as a current signal.

The transistor Q11, the transistor Q22, the transistor Q2, the resistor RE11 and the resistor RE12 may form a circuit 101, also referred to as a Darlington Cascode cell. The reference voltage circuit 102 may be connected to a base of the transistor Q22. An emitter of the transistor Q11 may be connected to a base of the transistor Q2 and to a first side of the resistor RE11. A second side of the resistor RE11 is generally connected to a ground node. An emitter of the transistor Q22 is generally connected to a base of the transistor Q2. An emitter of the transistor Q2 is generally connected to a first side of a resistor RE2. A second side of the resistor RE2 is generally connected to the ground node.

The transistor Q22 is generally implemented in place of the diode D1 of FIG. 3. The transistor Q22 may provide similar breakdown voltage and thermal stability as the circuit 50 described in the background section while improving and not compromising bandwidth performance.

The common-base transistor Q22 generally breaks a positive thermal-electric feedback from the signal OUT to the base of the transistor Q2, increasing a thermal stability of the Darlington Cascode cell 101 as well as improving an effective output breakdown voltage to Vbe+BVceo. The reference voltage circuit 102 may provide/ensure wide band common-base operation, thermal stability and electrical stability. The reference voltage circuit 102 may be implemented with a low impedance output stage that may be connected to a base of the common-base transistor Q22. The reference voltage circuit 102 may be configured to provide a base bias signal or voltage to the transistor Q22. In one example, the circuit 102 may be implemented as a band-gap reference and voltage generation circuit. However, the reference voltage circuit 102 may be implemented as any appropriate low impedance voltage reference generator to meet the design criteria of a particular application. The circuit 102 may reduce a thermal-electric feedback of the transistor Q22. Generally, the lower the impedance of the reference voltage circuit 102, the higher the effective breakdown voltage of the circuit 100.

Furthermore, the voltage reference 102 may provide electronic bias optimization. For example, bias tuning the base of the transistor Q22 via adjustment of the circuit 102 impedance and/or bias signal may provide improved intermodulation distortion response (when compared to conventional approaches) due to the optimization of cancellation mechanisms within the topology of the circuit 100. In addition, the implementation of different RF load impedances on the bases of the transistors Q11 and Q22 (e.g., implementing the circuit 102 having different impedances) may also provide uniquely optimized intermodulation distortion.

Figure 7:
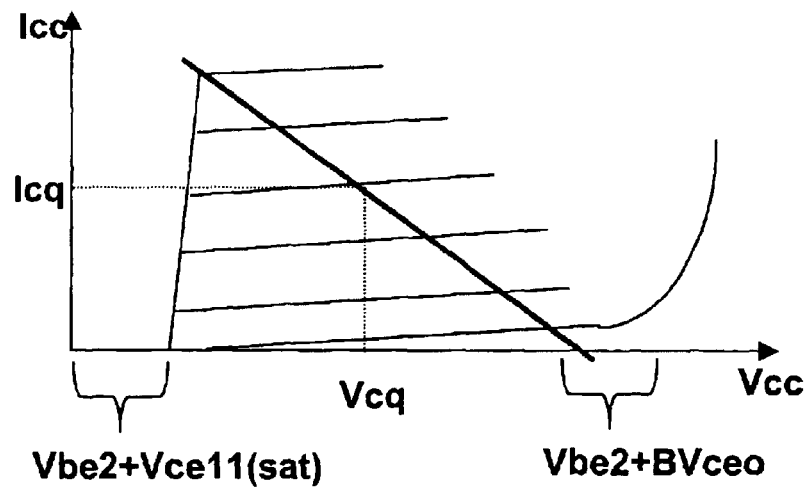
FIG. 7 is a diagram illustrating a response of the preferred embodiment of the present invention.

Referring to FIG. 7, a plot of the Darlington Cascode circuit 100 is shown. FIG. 7 generally assumes a simple case where (i) the resistor RE2=0 and (ii) a practical bias voltage across the transistor Q2 may be Vce2=Vbe. In comparison to the conventional circuit 10 from FIG. 2, the Darlington Cascode circuit 100 may have a higher breakdown voltage (e.g., Vbe2+BVceo) than the conventional circuit 10 (e.g., BVceo (Q2)).

Figure 8:
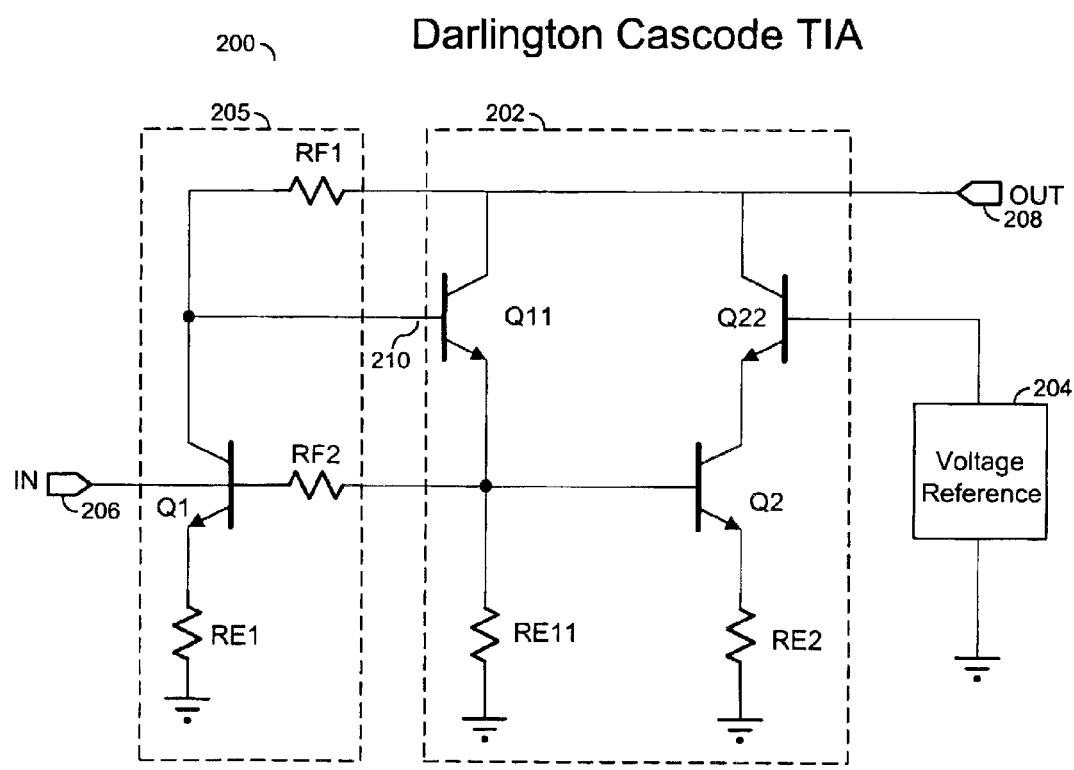
FIG. 8 is a circuit diagram of the present invention implemented in the context of a transimpedance amplifier.

Referring to FIG. 8, a circuit 200 implementing a Darlington Cascode transimpedance pre-amplifier is shown. The circuit 200 generally comprises a circuit or cell 202, a reference voltage 204 and a circuit 205. The cell 202 is similar to the Darlington Cascode cell 101 in FIG. 6. The cell 202 generally comprises the transistor Q2, the transistor Q1, the transistor Q22, the resistor RE11 and the resistor RE2. The circuit 205 generally comprises a resistor (e.g., RF1), a resistor (e.g., RF2), a transistor (e.g., Q1) and a resistor (e.g., RE1). The circuit 205 may be referred to as an input circuit and/or input stage.

The signal IN is generally presented through an input node 206 to a base of the transistor Q1 and a first side of the resistor RF2. A second side of the resistor RF2 is generally connected to a node between an emitter of the transistor Q11, a base of the transistor Q2 and the first side of the resistor RE11. The resistor RF2 generally provides a feedback path for a portion of the signal OUT at the emitter node of the transistor Q11 back into the signal IN at the base of the transistor Q1. A collector of the transistor Q1 is generally connected to a base of the transistor Q11, a first side of the resistor RF1. An emitter of the transistor Q1 is generally connected to a first side of the resistor RE1. The second side of the resistor RE1 is generally connected to a ground node. The resistor RF1 may provide a feedback path for a portion of the signal OUT at the output node 208 to the base of transistor Q11. The feedback resistors RF1, RF2 and series feedback resistor RE1 may be adjusted for optimum gain, bandwidth, noise and input linearity response.

The Darlington Cascode amplifier of the present invention may be applied to transimpedance pre-amplifier. The circuit 200 illustrates an example that may be implemented in a InP HBT TIA design. The transistor Q1, along with the resistors RF1, RF2 and RE1 generally form a common-emitter input transistor stage providing parallel feedback.

The circuit 200 illustrates several features of the resultant Darlington Cascode transimpedance pre-amplifier (TIA). The Darlington Cascode cell 202 (with the salient features already described) generally comprises an emitter-follower transistor Q11, a bias resistor RE11, a common-emitter transistor Q2, a series feedback resistor RE2 and a common-base transistor Q22. A reference voltage circuit 204 generally provides a low-impedance which may be frequency dependent and may be optimized for wide bandwidth. The reference voltage circuit 204 may also be optimized for thermal and electrical stability. The common-emitter pre-amplifier transistor Q1 may be directly coupled to an input 210 of the Darlington Cascode cell 202. The series feedback resistor RE1, and two parallel feedback resistors RF1 and RF2, may be used for setting a gain, transimpedance, bandwidth, input impedance, overload and/or sensitivity of the circuit 200.

The circuit 200 is generally designed for 40 Gb/s fiber optic applications, such as SONET OC-768. A small signal gain and bandwidth design targets may be 25 dB and 50 GHz, respectively. A differential transimpedance gain target is generally 2000 ohms. The circuit 200 may be implemented using commercially available InP DHBT technology with fT=175 GHz and fmax=200 Ghz. However, the circuit 200 may be implemented with other transistor semiconductor technologies such as SiGe HBT, GaAs HBT, pseudo-morphic high electron mobility transistors (PHEMT), and/or CMOS transistors.

Figure 9:
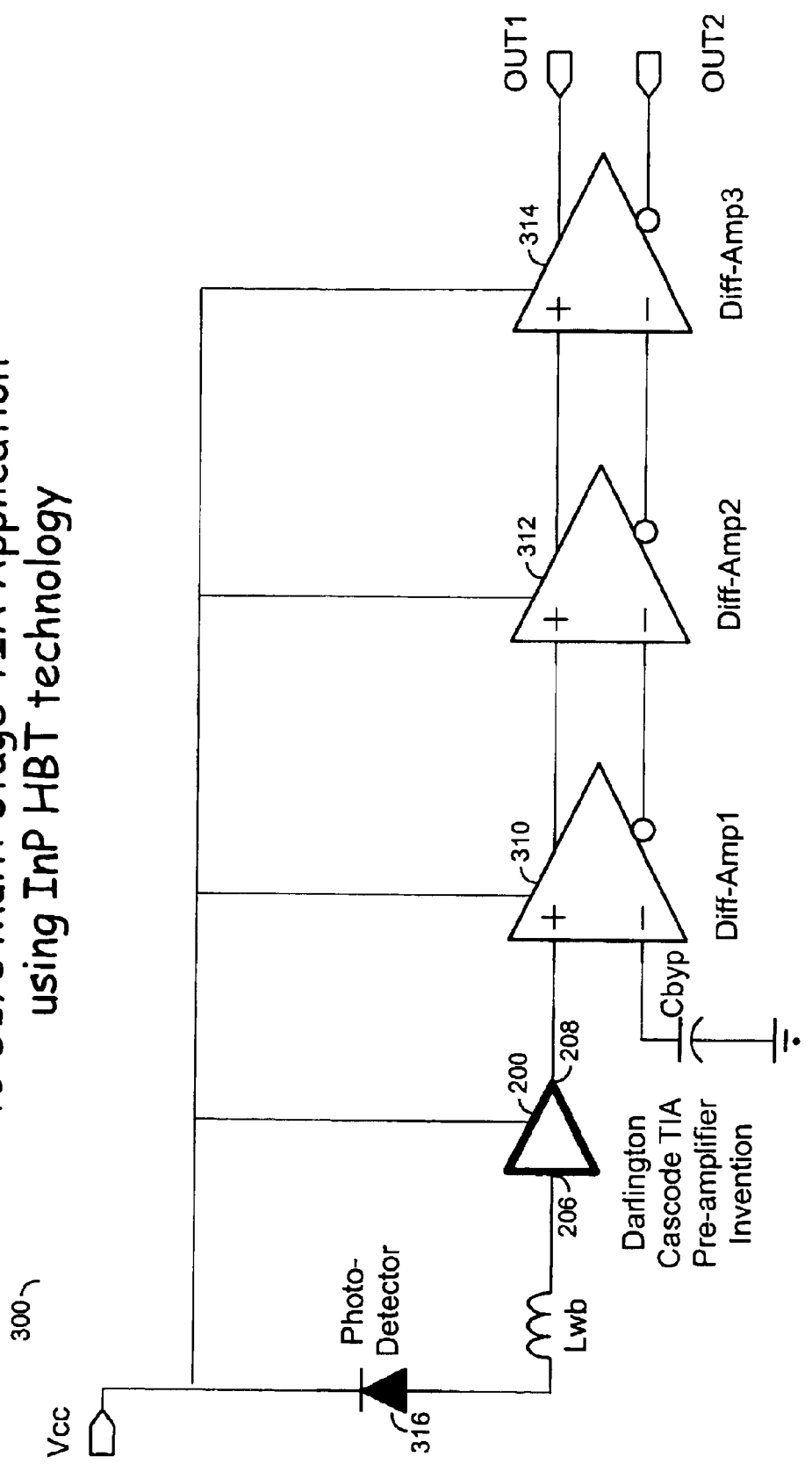
FIG. 9 is a circuit diagram of a multi-stage application of the present invention.

Referring to FIG. 9, a circuit 300 illustrating an embodiment of a multi-stage TIA application of the Darlington Cascode transimpedance pre-amplifier is shown. The circuit 300 generally shows an application of the Darlington Cascode TIA circuit 200 of FIG. 8 as applied to a multi-stage TIA amplifier. The multi-stage TIA amplifier 300 may be implemented using an InP HBT technology with fT and fmax greater than 150 GHz and 200 GHz, respectively. The BVCEO may be about 3V and the Vbe(on) may be about 0.85V. However, other topologies may be implemented to meet the design criteria of a particular implementation.

The multi-stage TIA circuit 300 of FIG. 9 may generally be implemented as the Darlington Cascode pre-amplifier 200 of FIG. 8, followed by three differential amplifier circuits or stages 310, 312 and 314. The first stage 310 illustrates a bypass capacitor Cbyp on the undriven port to represent singled-ended to differential conversion. A photodetector/photodiode 316 may be attached to the input 206 of the circuit 200 to depict a photo-receiver application. A series inductance (e.g., Lwb) is shown to represent a finite interconnect inductance, which could be a wire or ribbon bond for a discrete integration. The inductance Lwb may also be implemented as an interconnect tuning inductance (such as a spiral inductor) for a monolithically integrated solution.

The circuit 300 was fabricated and measured on-wafer using high speed microwave probes, cascade SOLT (Shorts, Opens, Loads and Thrus) calibration, and a 50 GHz vector network analyzer. The following measurements of the invention are of a 40 Gb/s transimpedance amplifier produced with a commercially available InP HBT technology with fT>150 Ghz, fmax>200 GHz, and a breakdown voltage of about 3–3.5V. A base-emitter bias voltage Vbe was about 0.85V. A target application for the produced amplifier may be a 40 Gb/s photo-receiver for SONET OC-768.

The Darlington Cascode TIA pre-amplifier circuit 200 of FIG. 8 was applied to the multi-stage TIA topology of FIG. 9 and fabricated. A variation of the amplifier was also fabricated wherein the diode D1 of the circuit 50 of FIG. 4 was employed in place of the common-base transistor Q22 of FIG. 6, in order to provide a reference measurement for comparison.

Direct comparisons of the measured results demonstrates a bandwidth improvement gained by the Darlington Cascode amplifier of the present invention. Both amplifiers demonstrates reliable, robust 3.3V supply operation compared to previously realized conventional Darlington approaches, which had resulted in low DC functional yield due to the conventional Darlington amplifiers burning out during the application of the 3.3V supply.

Figure 10:
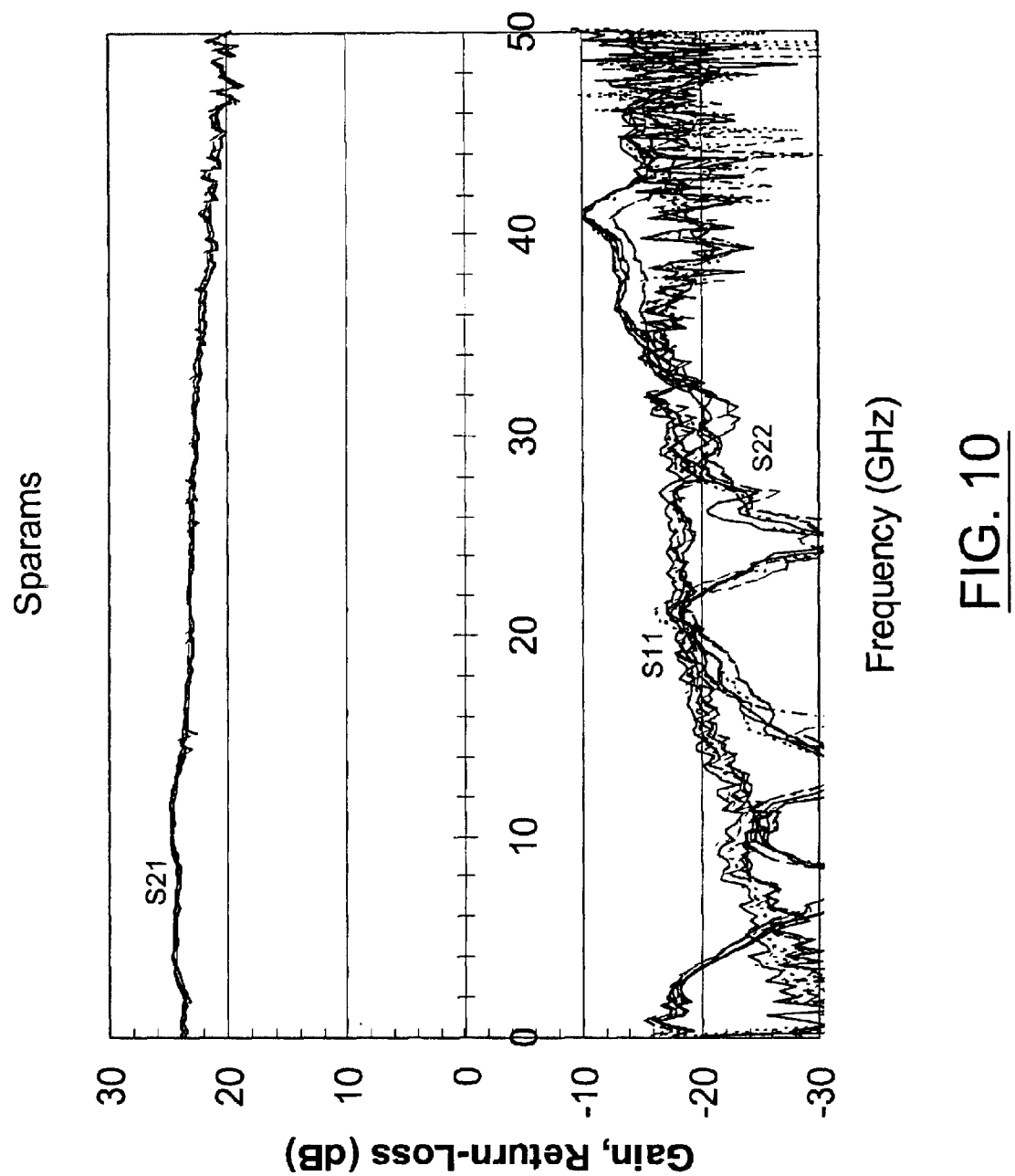
FIG. 10 is a diagram of a measured small signal response of the modified conventional Darlington amplifier of FIG. 4.

Referring to FIG. 10, a small signal response of the modified-conventional Darlington circuit 50 of FIG. 4 is shown. Fabrication of the modified conventional Darlington circuit 50 with diode D1 yielded repeatable results over five sites across a test wafer. A forward transmission parameter (e.g., S21) gain of 24 dB with a 3 dB bandwidth of 43 GHz was achieved. An input return loss parameter (e.g., S11) and an output return loss parameter (e.g., S22) were both better than −15 dB up through 30 GHz and were both better than −10 dB up to 50 GHz.

Figure 11:
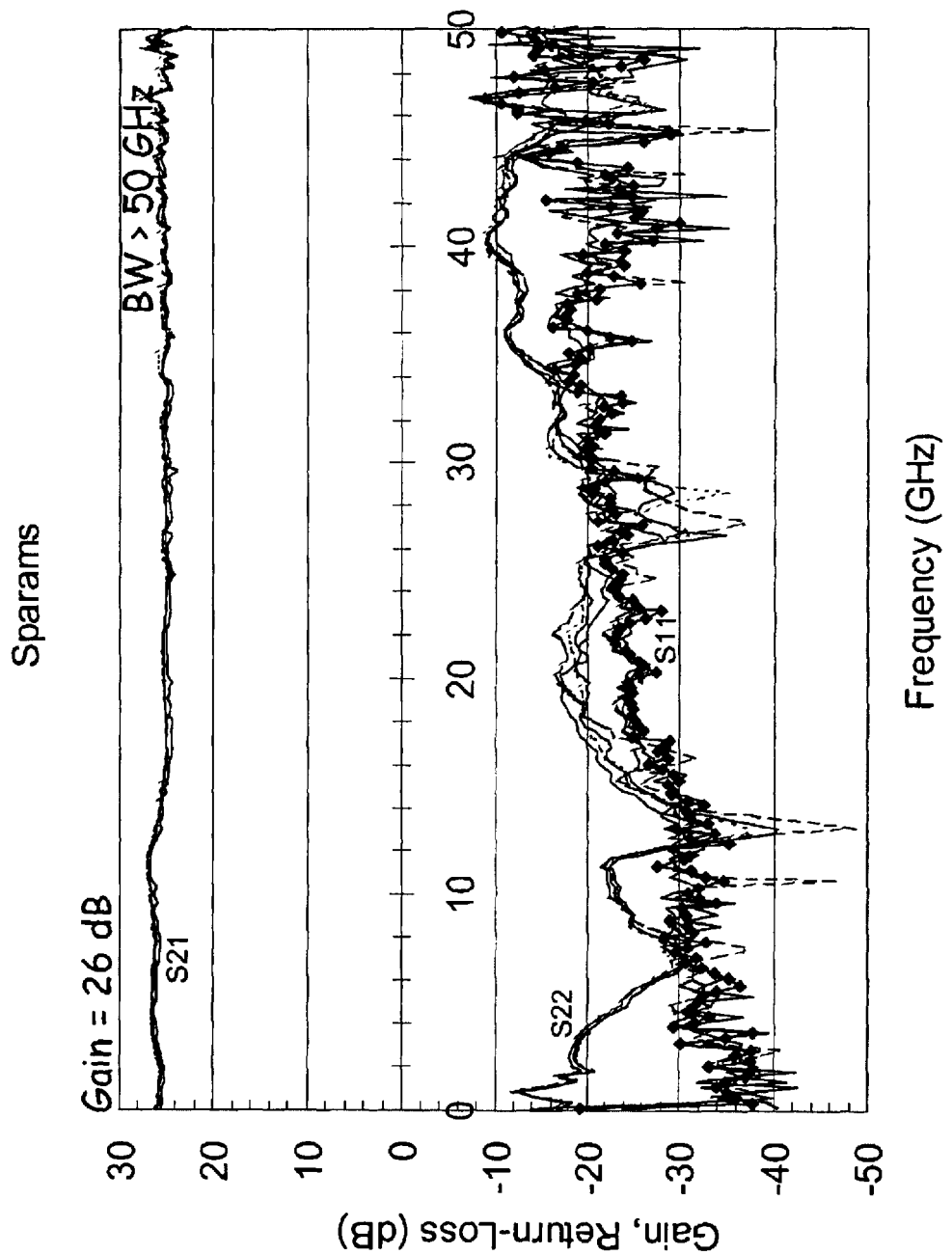
FIG. 11 is a diagram of a measured small signal response of the present invention.

Referring to FIG. 11, a small signal response of the present invention is shown for the Darlington Cascode pre-amplifier approach of the present invention. Fabrication of the Darlington Cascode circuit 200 combined with multi-stage realization of FIG. 9 also yielded repeatable results over five sites across the test wafer. A forward transmission parameter S21 gain of 26 dB with a 3 dB bandwidth greater than 50 GHz was achieved, thereby demonstrating a widest know bandwidth for a TIA with greater than 25 dB gain. An input return loss parameter S11 and an output return loss parameter S22 were generally better than −12 to −15 dB up through 30 GHz and were better than −10 dB up to 50 GHz. Therefore, the Darlington Cascode amplifier of the present invention generally obtains 2 dB more gain and greater than 16% more bandwidth that conventional Darlington amplifiers. A total gain bandwidth product of the Darlington Cascode circuit of the present invention is generally improved by more than 20% over the conventional Darlington approach.

Figure 12:
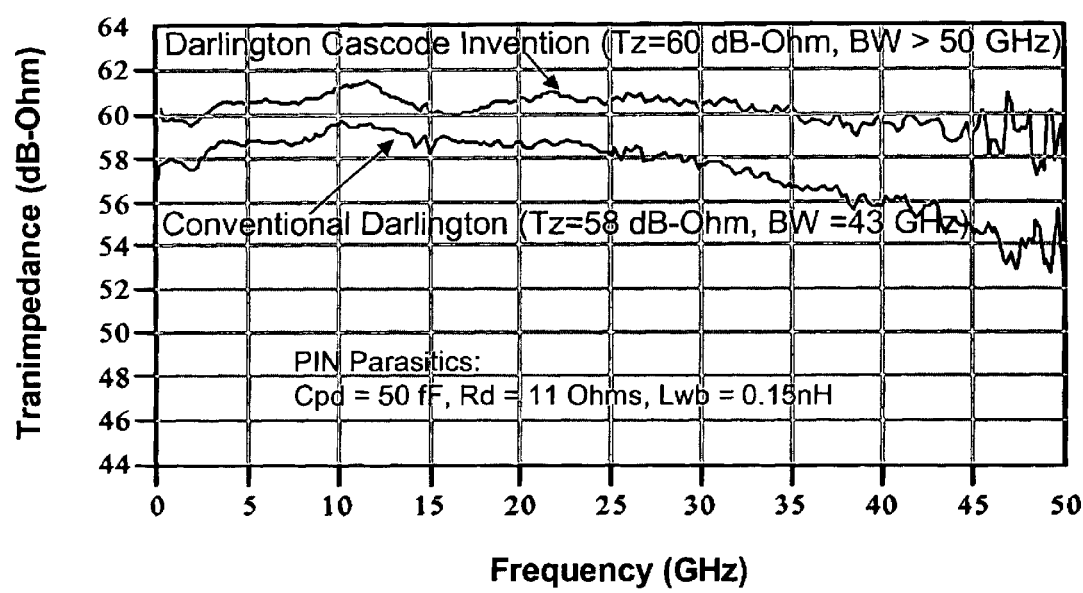
FIG. 12 is a diagram comparing a transimpedance performance of the present invention with a performance of a modified conventional Darlington amplifier.
Figure 6:
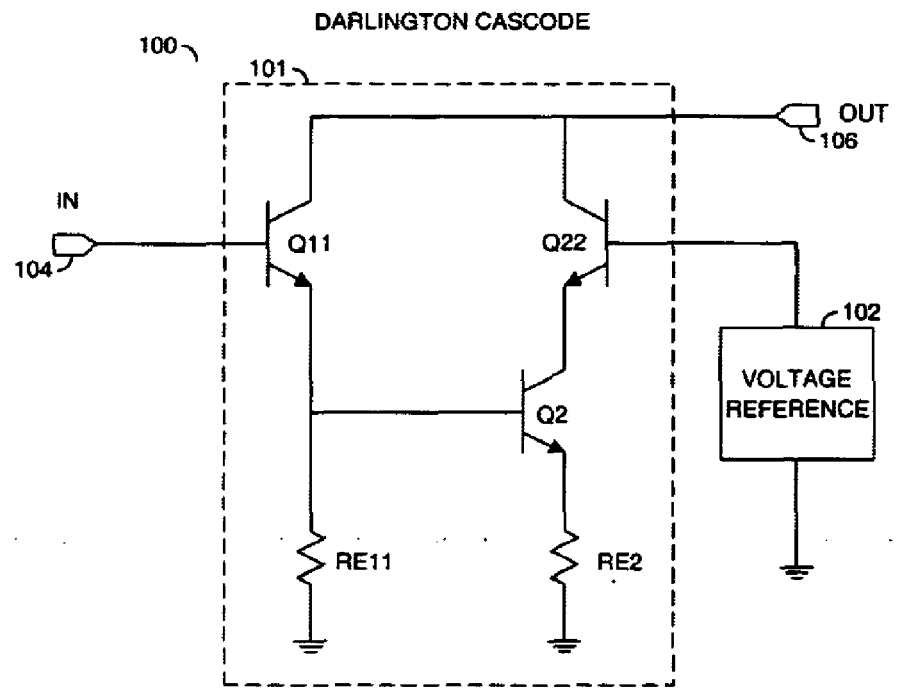
Figure 7:
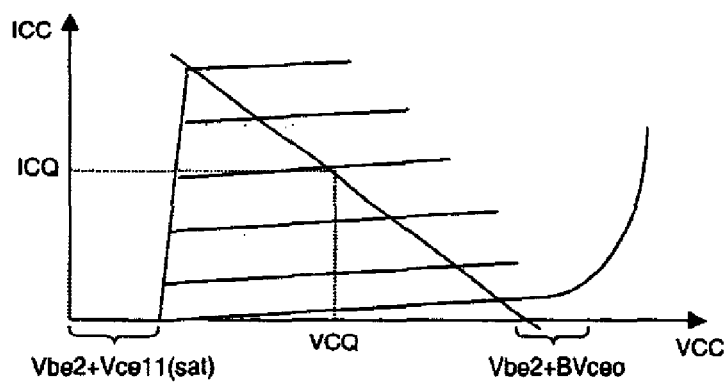
Figure 8:
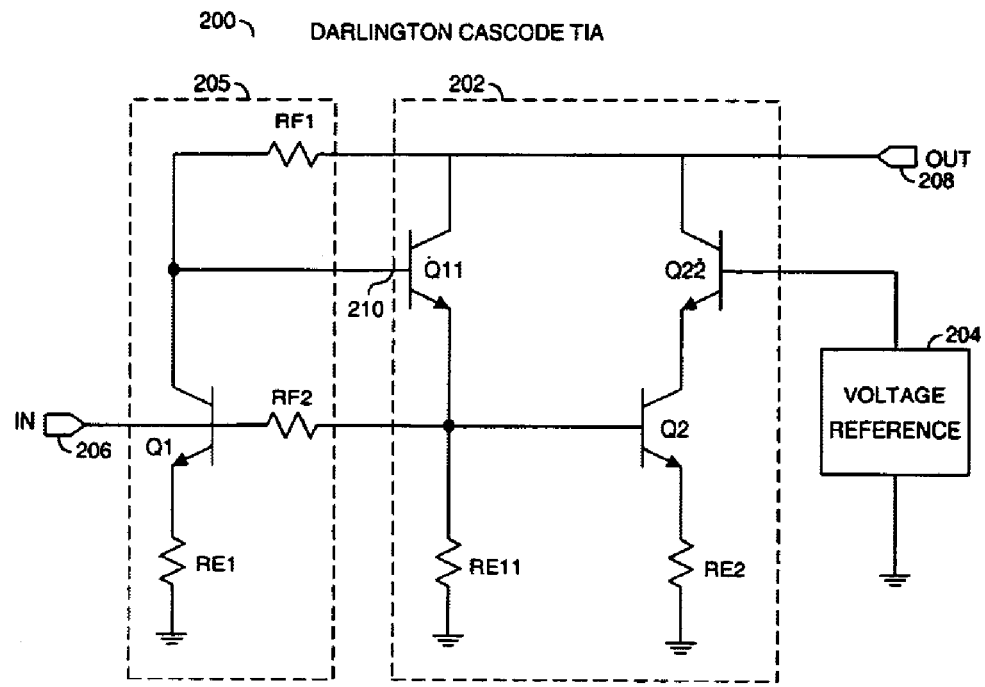
Figure 9:
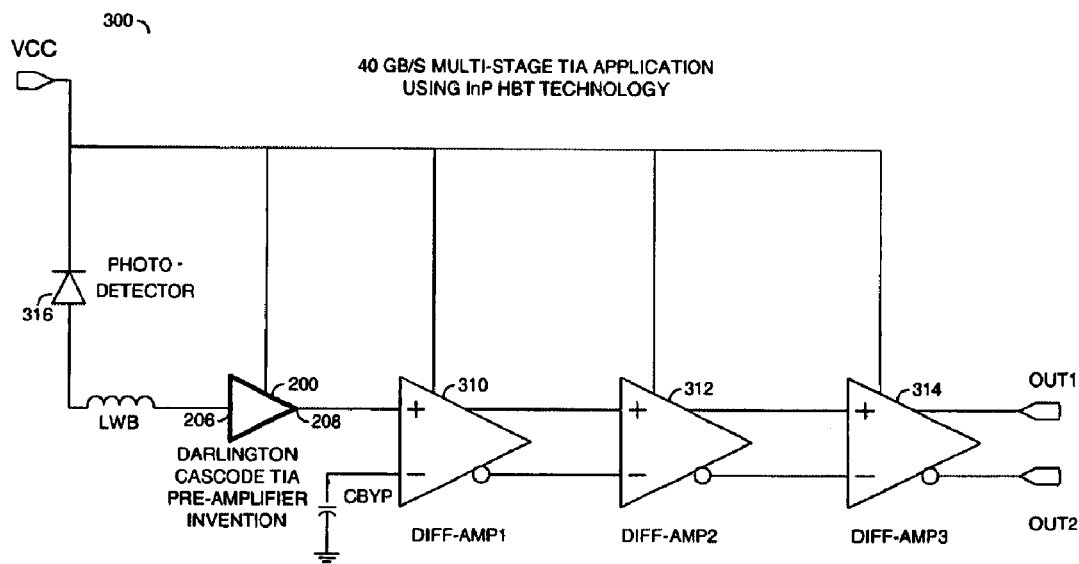
Figure 10:
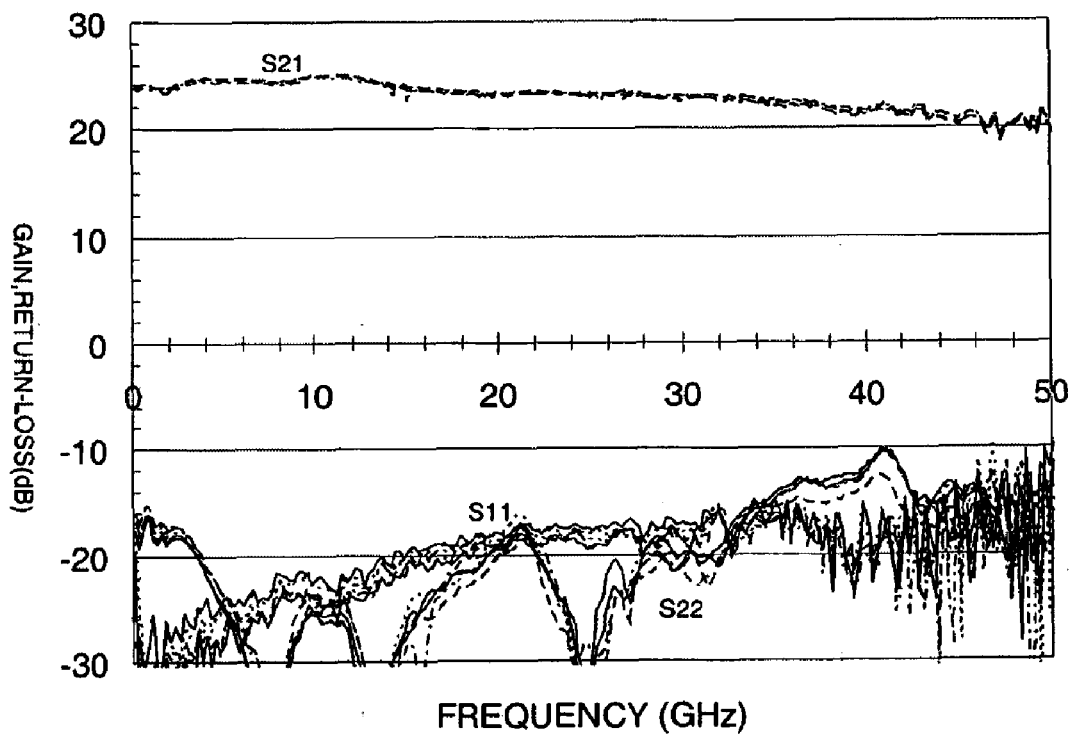
Figure 11:
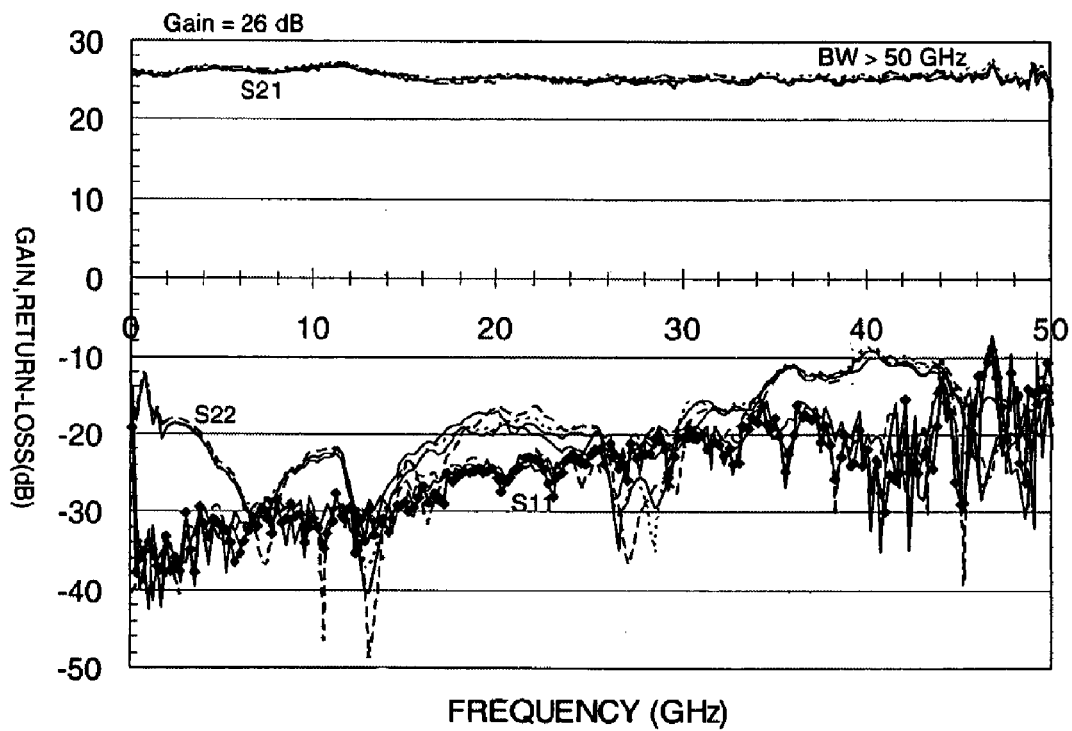
Figure 12:
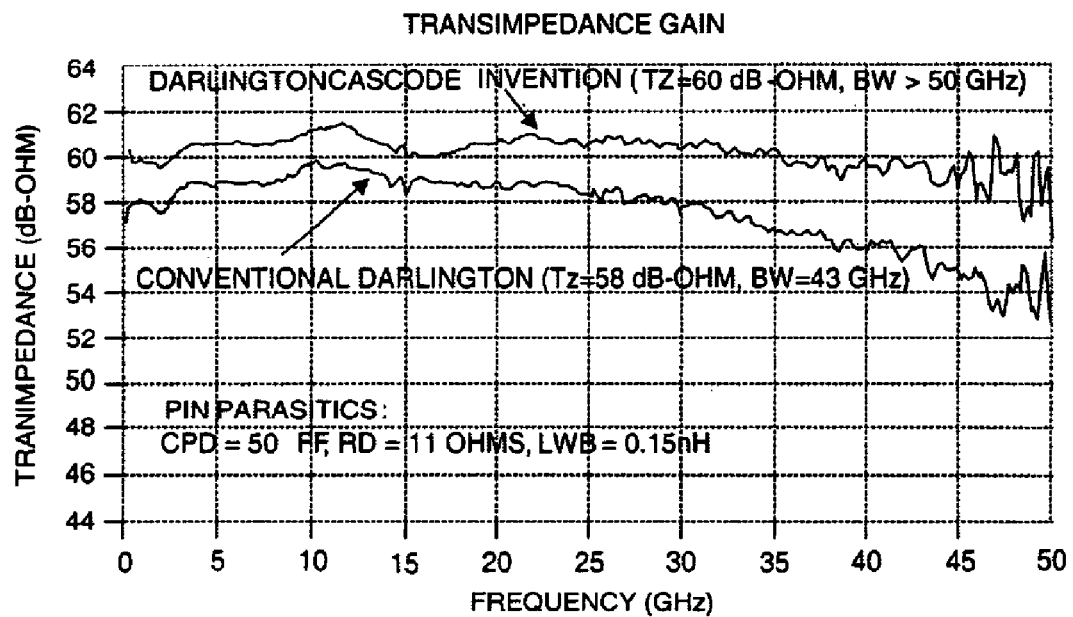

Referring to FIG. 12, a graph illustrating a direct comparison of transimpedance performance is shown. The comparison illustrates a calculated transimpedance response incorporating parasitics of a typical 40 Gb/s PIN photo-diode(e.g., Cpd=50 fF, Rd=11 ohms and Lwb=0.15 nH) coupled to an input of the amplifier. The conventional Darlington approach obtained a 58 dB-ohm transimpedance with a 43 Gz 3-dB bandwidth, while the Darlington Cascode architecture of the present invention obtained a 60 dB-ohm transimpedance over a greater than 50 GHz 3-dB bandwidth. The Darlington Cascode circuit may achieve a 2 dB higher transimpedance gain and 7 GHz more bandwidth than a conventional Darlington circuit. The present invention may also obtain a greater than 20% higher transimpedance-bandwidth product compared to a conventional design, similar to a gain bandwidth product obtained from the S-parameters measurement comparison. The Darlington Cascode circuit generally offers significant gain bandwidth improvements over the conventional approaches while ensuring the same reliable operation as the modified Darlington approach.

The new cascode amplifier topology may enable higher gain-bandwidth, higher output power, and better thermal stability as compared to the conventional Darlington for many applications. Applications relying on high speed processes, where breakdown voltage is compromised for increased device fT, may include, but is not limited to (i) wideband buffer amplifiers for RF and analog IC, (ii) transimpedance amplifiers, (iii) limiter and saturated type amplifiers, (iv) transmit chain pre-drivers, (v) wideband 2–18 GHz electronic warfare circuits, and (vi) wideband test equipment including active doublers.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III–V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a Darlington transistor pair configured to generate an output signal at an output node in response to an input signal received through an input node; and
    a common-base transistor (i) coupled between a first collector of an output transistor of said Darlington transistor pair and a second collector of an input transistor of said Darlington transistor pair and (ii) having a base configured to receive a reference voltage.

2. The apparatus according to claim 1, further comprising:
    a voltage generation circuit configured to generate said reference voltage.

3. The apparatus according to claim 2, wherein said voltage generation circuit comprises a band-gap reference voltage circuit.

4. The apparatus according to claim 2, wherein said voltage generation circuit comprises a low impedance circuit.

5. The apparatus according to claim 2, wherein an impedance presented by said voltage generation circuit is adjustable to change an intermodulation distortion response of said apparatus.

6. The apparatus according to claim 2, wherein said reference voltage presented by said voltage generation circuit is adjustable to change an intermodulation distortion response of said apparatus.

7. The apparatus according to claim 2, wherein said voltage generation circuit is configured to reduce a thermal-electric feedback of said common-base transistor.

8. The apparatus according to claim 1, wherein said common-base transistor is configured to improve an overall breakdown voltage of said apparatus.

9. The apparatus according to claim 1, wherein said common-base transistor is configured to break a feedback of said output signal to a base of said output transistor of said Darlington transistor pair.

10. The apparatus according to claim 1, wherein said common-base transistor improves a dynamic range of said apparatus.

11. The apparatus according to claim 1, wherein said common-base transistor improves a voltage swing of said output signal.

12. The apparatus according to claim 1, further comprising:
    a common-emitter input stage connected to said Darlington transistor pair.

13. The apparatus according to claim 1, further comprising a common-emitter transistor coupled between said Darlington transistor pair and said input node.

14. The apparatus according to claim 13, further comprising:
    a first resistive path coupled between said output node and a collector of said common-emitter transistor; and
    a second resistive path coupled between a base of said output transistor and a base of said common-emitter transistor.

15. The apparatus according to claim 1, further comprising:
    a plurality of amplifier circuits connected to each other in series, wherein a first of said amplifier circuits receives said output signal.

16. An apparatus comprising:
    means for generating an output signal at an output node in response to an input signal comprising a Darlington transistor pair; and
    means for coupling a common-base transistor between two collectors in said Darlington transistor pair, wherein said common-base transistor has a base configured to receive a reference voltage.

17. A method for generating an output signal having a dynamic range, comprising the steps of:
    (A) generating said output signal at an output node in response to an input signal at an input node using a Darlington transistor pair; and
    (B) biasing a common-base transistor coupled between two collectors in said Darlington transistor pair with a reference voltage.

18. The method according to claim 17, further comprising the step of:
    generating said reference voltage via a band-gap reference voltage generation circuit.

19. The method according to claim 17, further comprising the step of:
    adjusting an impedance presented by a circuit generating said reference voltage to change said dynamic range of said output signal.

20. The method according to claim 17, further comprising the step of:

feeding a portion of said output signal back to a base of an input transistor of said Darlington transistor pair.

21. The method according to claim 17, further comprising the step of:

feeding a portion of said output signal back into said input signal.

22. The method according to claim 17, further comprising the step of:

amplifying said input signal before reception by said Darlington transistor pair.

23. The apparatus according to claim 1, wherein said common-base transistor is configured to improve a thermal stability of said apparatus.

24. The apparatus according to claim 1, wherein said common-base transistor is configured to improve a bandwidth of said apparatus.

25. An apparatus comprising:

a first transistor having (i) a first collector connected to an output node, (ii) a first base configured to receive to an input signal through an input node and (iii) a first emitter;

a second transistor having (i) a second base connected to said first emitter and (ii) a second collector; and a third transistor in a common-base arrangement (i) coupled between said second collector and said output node and (ii) having a third base configured to receive a reference voltage.

26. The apparatus according to claim 1, further comprising:

a Darlington transistor pair configured to generate an output signal at an output node in response to -an input signal received through an input node;

a common-base transistor (i) coupled between an output transistor of said Darlington transistor pair and said output node and (ii) having a base configured to receive a reference voltage; and a common-emitter input stage with a plurality of parallel feedback paths connected to said Darlington transistor pair.

27. The apparatus according to claim 26, wherein said common-emitter input stage comprises a common-emitter transistor coupled between said Darlington transistor pair and said input node.

28. The apparatus according to claim 26, further comprising:

a first resistive path coupled between said output node and a collector of said common-emitter transistor; and a second resistive path coupled between a base of said output transistor and a base of said common-emitter transistor.

29. The apparatus according to claim 12, wherein said common-emitter input stage comprises a plurality of feedback paths.

* * * * *

UNITED STATES PATENT AND TRADEMARK OFFICE
CERTIFICATE OF CORRECTION

PATENT NO.      : 6,806,778 B1
DATED           : October 19, 2004
INVENTOR(S)     : Kevin W. Kobayashi It is certified that error appears in the above-identified patent and that said Letters Patent is hereby corrected as shown below:

Formal Drawings filed on September 9, 2004 were not published with the issued patent. Please insert attached Formal Drawings, FIGS. 1-12.

Signed and Sealed this

Thirty-first Day of May, 2005

JON W. DUDAS
*Director of the United States Patent and Trademark Office*

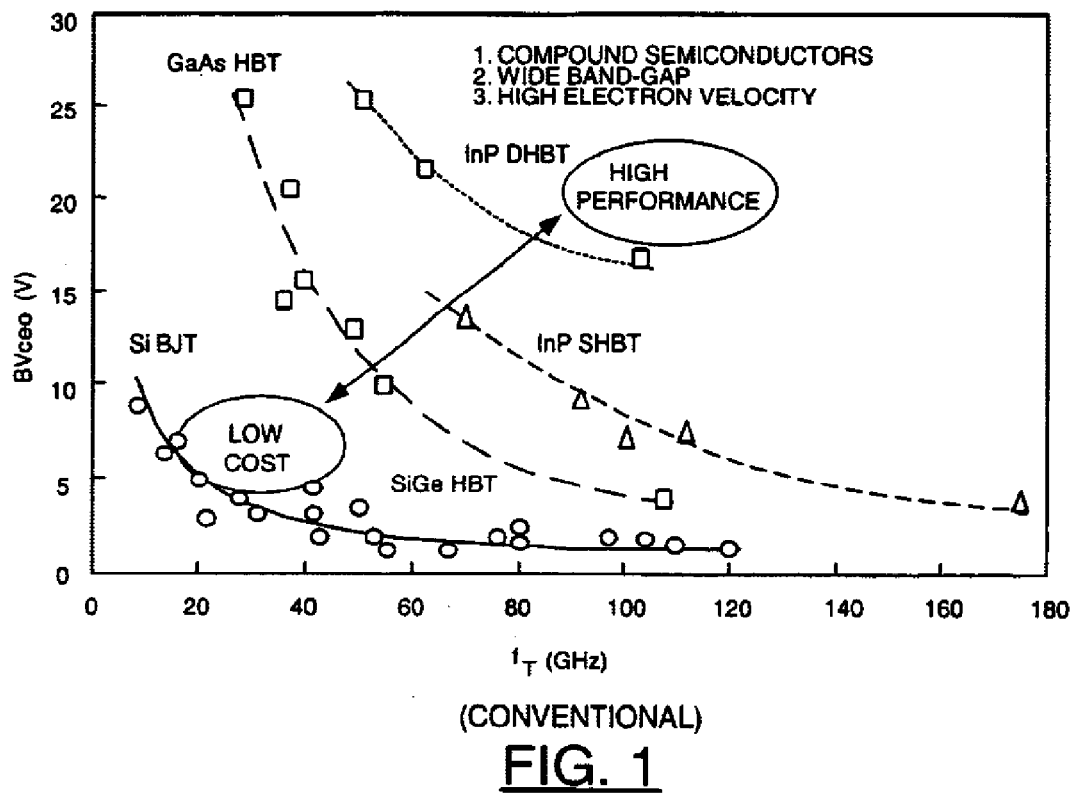
(CONVENTIONAL)
FIG. 1

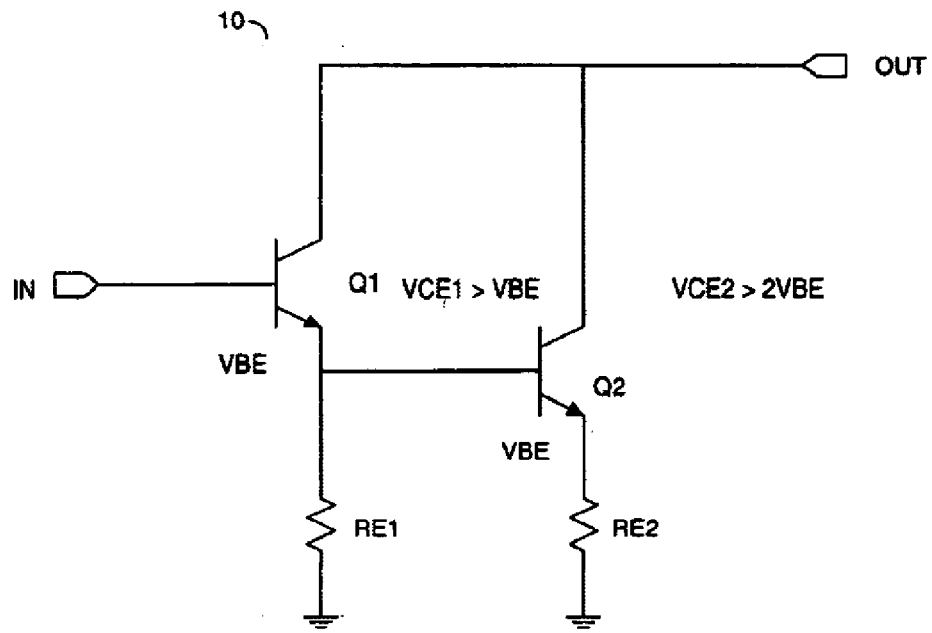
(CONVENTIONAL)
FIG. 2
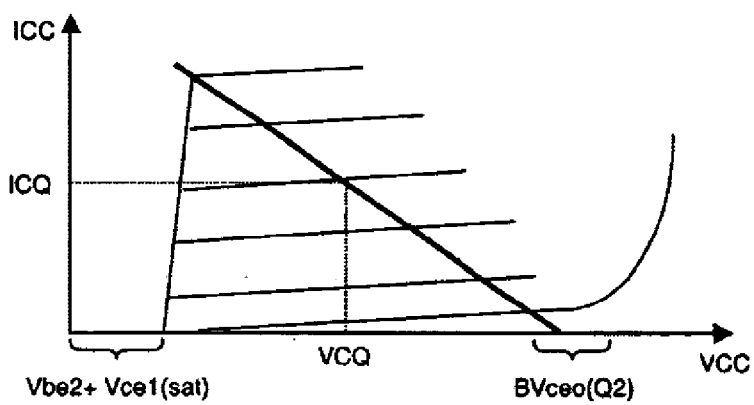
(CONVENTIONAL)
FIG. 3

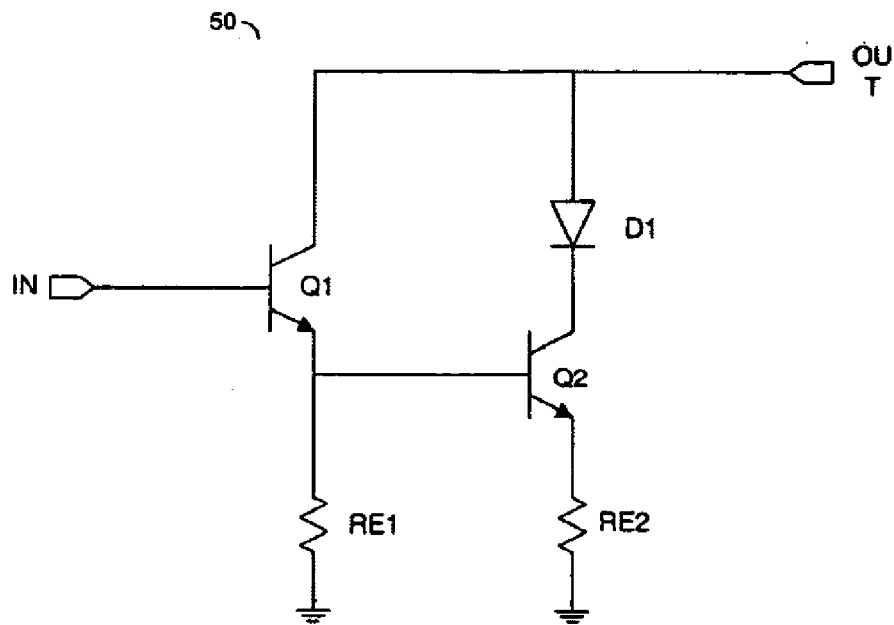
(CONVENTIONAL)
FIG. 4
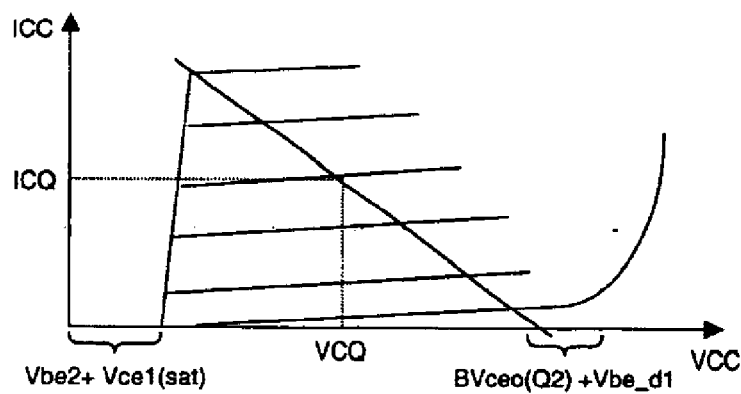
(CONVENTIONAL)
FIG. 5